United States Patent [19]
Nadd

[11] Patent Number: 5,569,982
[45] Date of Patent: Oct. 29, 1996

[54] CLAMPING CIRCUIT FOR IGBT IN SPARK PLUG IGNITION SYSTEM

[75] Inventor: Bruno C. Nadd, Puyvert, France

[73] Assignee: International Rectifier Corporation, El Segundo, Calif.

[21] Appl. No.: 442,813

[22] Filed: May 17, 1995

[51] Int. Cl.⁶ .................................................. F02P 3/02
[52] U.S. Cl. ................................ 315/209 T; 123/645
[58] Field of Search ........................ 315/209 T, 209 R, 315/291, 307; 123/645, 594

[56] References Cited

U.S. PATENT DOCUMENTS

| | | | |
|---|---|---|---|
| 3,949,722 | 4/1976 | Linstedt et al. | 81/28 |
| 4,077,379 | 3/1978 | Jundt et al. | 123/645 |
| 4,217,874 | 8/1980 | Sohner et al. | 123/594 |

*Primary Examiner*—Robert Pascal
*Assistant Examiner*—David Vu
*Attorney, Agent, or Firm*—Ostrolenk, Faber, Gerb & Soffen, LLP

[57] ABSTRACT

An ignition circuit for a spark plug includes an IGBT switch with a foldback clamp circuit. The foldback clamp has a first high clamp voltage for a first short interval to fire the spark plug, followed by a lower clamp voltage. The power dissipation of the IGBT switch is therefore substantially reduced.

33 Claims, 3 Drawing Sheets

5,569,982

CLAMPING CIRCUIT FOR IGBT IN SPARK PLUG IGNITION SYSTEM

BACKGROUND OF THE INVENTION

This invention relates to an ignition circuit for spark plugs, and more specifically relates to an IGBT for controlling the breakdown of a spark plug and a novel clamping circuit which reduces the necessary die area for the IGBT.

Ignition circuits for spark plugs are well known, wherein a switching device turns on to excite the primary winding of an ignition transformer from a d-c source. When the switch turns off, a sufficiently high voltage is induced in the secondary winding which is connected across the spark gap to cause a spark between the spark gap electrodes.

The switching device may take many forms, for example, mechanical contacts and semiconductor switching devices. MOSgated power semiconductor devices have been used, for example, power MOSFETs, IGBTs.

IGBTs used in spark plug ignition systems have been required by customer specifications to satisfy two conditions. The first is to have a maximum forward voltage drop $V_{CEON}$ of 1.8 volts or less at 7 amperes and at 125° C. This condition can be satisfied by an IGBT having a die size of 14 mm² (size 2), which is a relatively inexpensive die.

However, the second condition requires a die size of 25 mm² (size 4) which is more expensive. The second condition is the repetitive unclamped energy specification $W_{CER}$=200 mJ for a collector current of 12 amperes and a starting die temperature Tj of 100° C. This condition results from the fact that all the energy stored in the coil is dissipated in the IGBT if the spark does not occur (as due to a disconnected spark plug).

It would be very desirable to reduce the power dissipation in the power switching device under such conditions so that a smaller die size device can be used for spark plug ignition circuit application.

BRIEF DESCRIPTION OF THE INVENTION

In accordance with a first embodiment of the invention, a foldback clamp circuit is connected across the semiconductor switching device to reduce its power dissipation.

It can be shown that the energy rating $W_{CER}$ increases with the reduction in power dissipation P by a factor of $1/P^{1/2}$. The foldback clamp circuit reduces power dissipation and thus the die size for a given $W_{CER}$.

The foldback clamp circuit operates to have a first high clamp voltage, for example, 400 volts, for a sufficiently short time, for example, 10 to 20 microseconds, which is needed to strike the arc between the spark plug electrodes. After the arc strikes, the clamp voltage is reduced, for example to 80 volts, until the switch current reduces to zero. This process will then produce a substantially reduced (five-fold) power dissipation for the die, thus permitting a reduced die size for the power semiconductor by a theoretical factor of $\sqrt{5}$.

The circuitry used to switch the clamping voltage may take many forms, and can include a control MOSFET which can switch out a zener diode or resistor which are in a series circuit with other impedances after spark plug ignition. The user's microprocessor control can provide the necessary timing signals for switching the main and control semiconductor devices.

Other features and advantages of the present invention will become apparent from the following description of the invention which refers to the accompanying drawings.

DETAILED DESCRIPTION OF THE DRAWINGS

Figure 1:
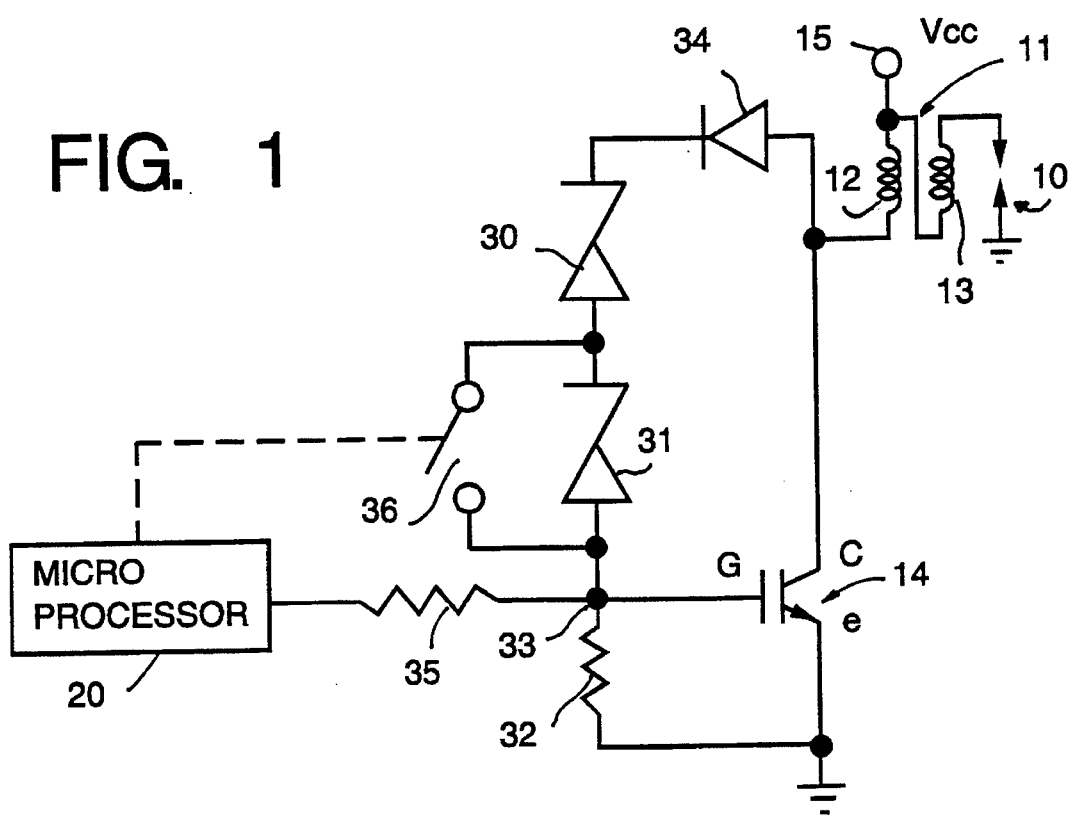
FIG. 1 is a circuit diagram of a first embodiment of the present invention.

Referring first to FIG. 1, there is shown a spark plug ignition circuit which contains a standard spark plug 10, a standard ignition transformer 11 having a primary winding 12 and secondary winding 13 with a turn ratio of 1:100, a MOSgated power semiconductor device 14, which is preferably an IGBT and a terminal 15 connected to the voltage Vcc (which may be a 12 volt automotive battery).

In prior art circuits, a simple clamping circuit consisting of a series-connected zener diode and conventional diode is connected from a main power electrode of device 14 to its gate to clamp the $V_{CE}$ of device 14. A microprocessor 20 or other control applies turn on and turn off signals to the gate G of IGBT 14.

The operation of this prior art circuit is best described with reference to FIGS. 4a, 4b and 4c.

Figure 4A:
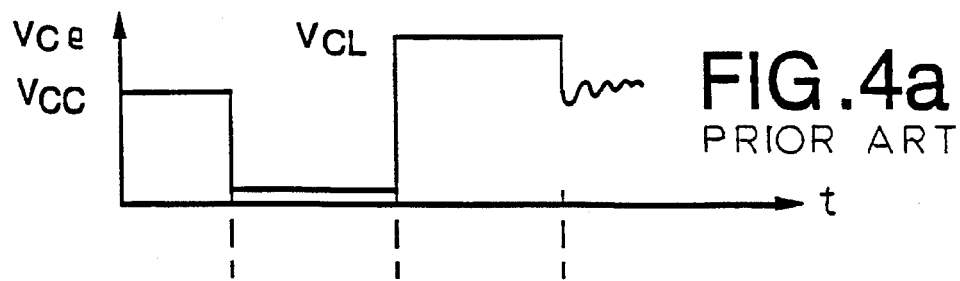
FIGS. 4a, 4b and 4c schematically show the waveforms of a prior art circuit on a common time base and, in particular, show the voltage across the main electrodes of the power semiconductor, its drain current and the input control signal respectively for the case of a disconnected plug.
Figure 4B:
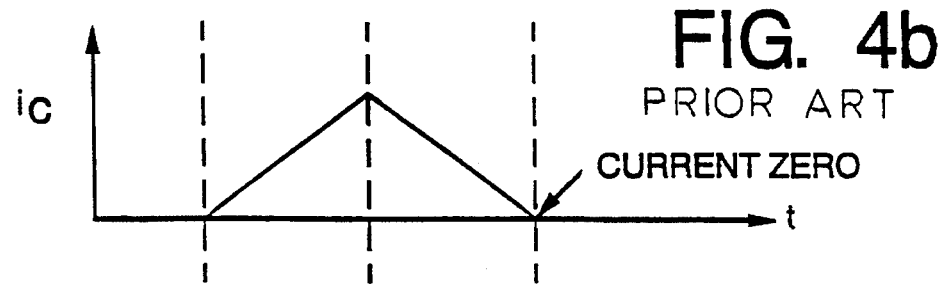
Figure 4C:
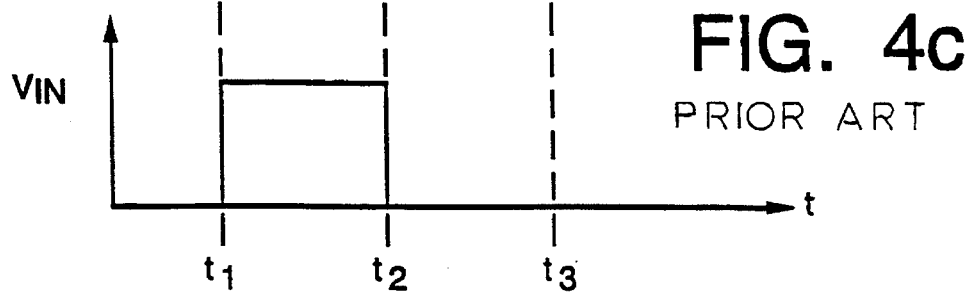

FIG. 4c shows the current voltage $V_{IN}$ which is the voltage of the input circuit to the gate G of IGBT 14 from the controller 20. The voltage Vcc which, in an automotive application is 12 volts, is applied to primary winding 12 and to the main terminals C and E of IGBT 14. At time $t_1$, a turn-on signal is applied to the gate G (FIG. 4c) and IGBT 14 turns on. Current $i_C$ (FIG. 4b) flows through winding 12 and IGBT 14 and an energy of the integral of $\frac{1}{2}I^2L$ is stored in winding 12 during this period. At time $t_2$, the input signal $V_{IN}$ is removed and IGBT 14 begins to turn off. This induces a high voltage in winding 12, for example, 400 volts, which induces a very high voltage (40,000 volts) in winding 13 which is high enough to cause an arc across the spark gap 10. This voltage may be clamped by a suitable clamp circuit to about 400 volts to protect the IGBT 14 if no spark occurs. That is, if no spark occurs, as due to a disconnected plug, all the energy stored in the coil 12 will be dissipated in the IGBT 14. This clamp voltage is shown as the voltage VcL in FIG. 4a.

The current $i_C$ begins to decay toward current zero at time $t_2$ and reaches zero at time $t_3$. During the time interval between times $t_2$ and $t_3$, excessive power is being dissipated in the IGBT 14.

Industry specifications commonly used for the IGBT in such an application therefore have required that the device must be able to withstand a repetitive unclamped energy of 200 mj for an $i_c$ of 12 amperes and starting junction temperature Tj of 100° C. This test requires an IGBT die area of 25 mm² (a size "4" die). However, the device need only pass a $V_{CEON}$ specification of 1.8 volts at 7 amperes and 125° C. This specification can be met by an IGBT die of only 14 mm² (about a size "2" die). If the power dissipation in the IGBT 14 under a no spark condition can be reduced, a smaller die size can be used in the ignition application. It can be shown that the energy rating $W_{CER}$ can be increased by $1/P^{1/2}$ where P is device power dissipation. This is shown as follows:

For a time t less than 1 millisecond, the transient thermal impedance Zth of a die is well estimated by:

$$Zth(t) = \frac{K}{S\,act} \sqrt{t}$$

where K is a constant and S act is the active area of the die.

For a rectangular pulse of power P the die energy is (E=Pt). The temperature change Δθ of the die is a good measure of a change of its area. That is, a reduced Δθ permits a reduced die area. The quantity Δθ is:

$$\Delta\theta = P\,Zth(t) = P\,\frac{K}{S\,act}\,\frac{\sqrt{E}}{P} = \frac{K}{S\,act}\,\sqrt{EP}$$

The above equation makes it possible to estimate die size reduction for constant Δθ (or Δθ reduction). For example, if E is kept constant and P is reduced by 5 (by the novel clamping circuit to be described), Δθ will be reduced by √5 or about 2.24. This calculation has been done with a rectangular power pulse for the sake of simplicity. Similar results can be found for a triangular power pulse.

Returning now to FIG. 1, there is shown the novel foldback clamp used to obtain a reduction in power dissipation of IGBT 14. Thus, a clamp circuit consisting of two zener diodes 30 and 31 is connected between the collector and the gate of IGBT 14. Resistor 32 is connected from zener diode 31 to ground. The gate of IGBT 14 is connected to the node 33 between zener diode 31 and resistor 32. A diode 34 is also provided as shown with the anode connected to the collector of IGBT 14 to block current flow when IGBT 14 is full on.

Microprocessor 20 is connected to node 33 through resistor 35. Microprocessor 20 is also connected to switch means 36, which may be a MOSFET and which is operable to short circuit zener diode 31 when switch 36 closes.

The circuit of FIG. 1 operates as follows:

At time $t_1$ in FIG. 4c, the input signal from microprocessor 20 turns on IGBT 14 through resistor 35. The voltage Vce of IGBT 14 drops to close to zero (FIG. 5a) and collector current $i_c$ begins to increase. At time $t_2$ in FIG. 4c the microprocessor 20 removes the gate signal from IGBT 14 which then turns off. The voltage across the coil 12 rises and exceeds the firing voltage for the spark gap (at winding 13) but the collector voltage of IGBT 14 is clamped to 400 volts by zener diode 30 and zener diode 31. The spark plug receives a high voltage corresponding to $V_{CL1}$ in FIG. 5a for up to about 20 microseconds and sufficiently long to ensure firing of the plug. Following this initial time of about 20 microseconds, and at $t_4$ the microprocessor 20 produces a signal to close or turn on the switch 36. This shorts out zener diode 31 and causes the clamping voltage to reduce to $V_{CL1}$ which is about 80 volts at time $t_4$ in FIGS. 5a and 5b. The current $i_c$ of FIG. 5 then reduces at a slower rate and turns off at time $t_3$.

Figure 5A:
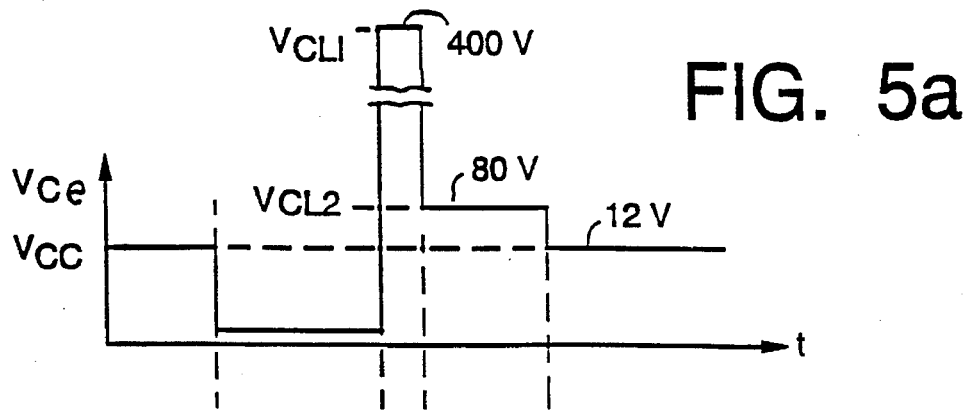
FIGS. 5a and 5b show the waveforms of the conditions of FIGS. 4a and 4b respectively, when using the circuits of the invention on the common time base of FIG. 4c for the case of a disconnected plug.
Figure 5B:
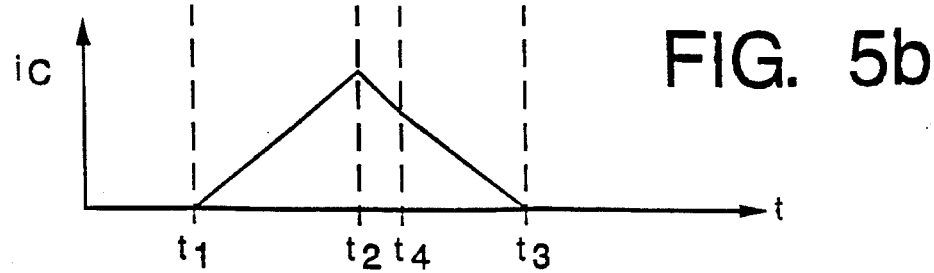

By reducing the clamping voltage to $V_{CL2}$ in FIG. 5a, the power dissipation in the IGBT die 14 is reduced about five-fold from that produced in the prior art circuits whose operation is shown in FIGS. 4a and 4b. Thus, its size is drastically reduced for a given energy rating.

Figure 2:
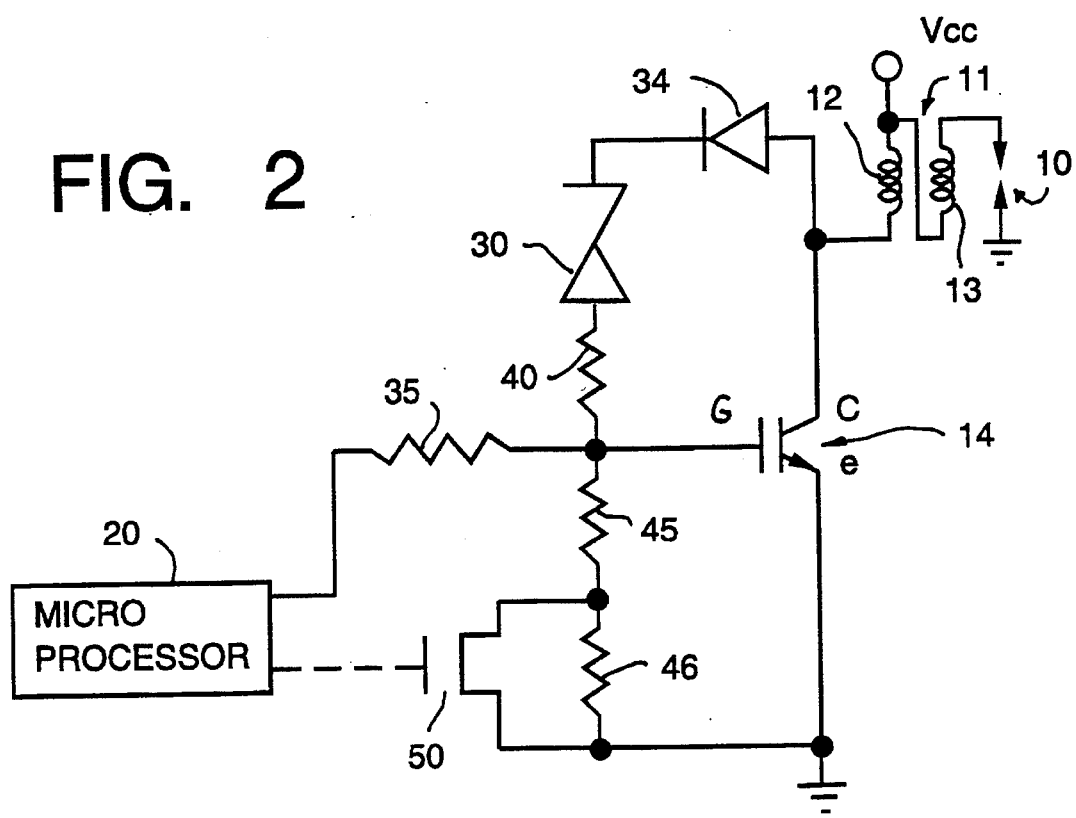
FIG. 2 is a circuit diagram of a second embodiment of the invention.

FIG. 2 shows a second embodiment of the invention in which zener diode 31 is replaced by resistor 40. Resistor 32 of FIG. 1 is replaced by resistors 45 and 46. A control MOSFET 50 is connected across resistor 46 and is opened (turned off) at time $t_4$ in FIG. 5a to short out resistor 46 and to again reduce the clamping voltage to about 80 volts at time $t_4$.

Figure 3:
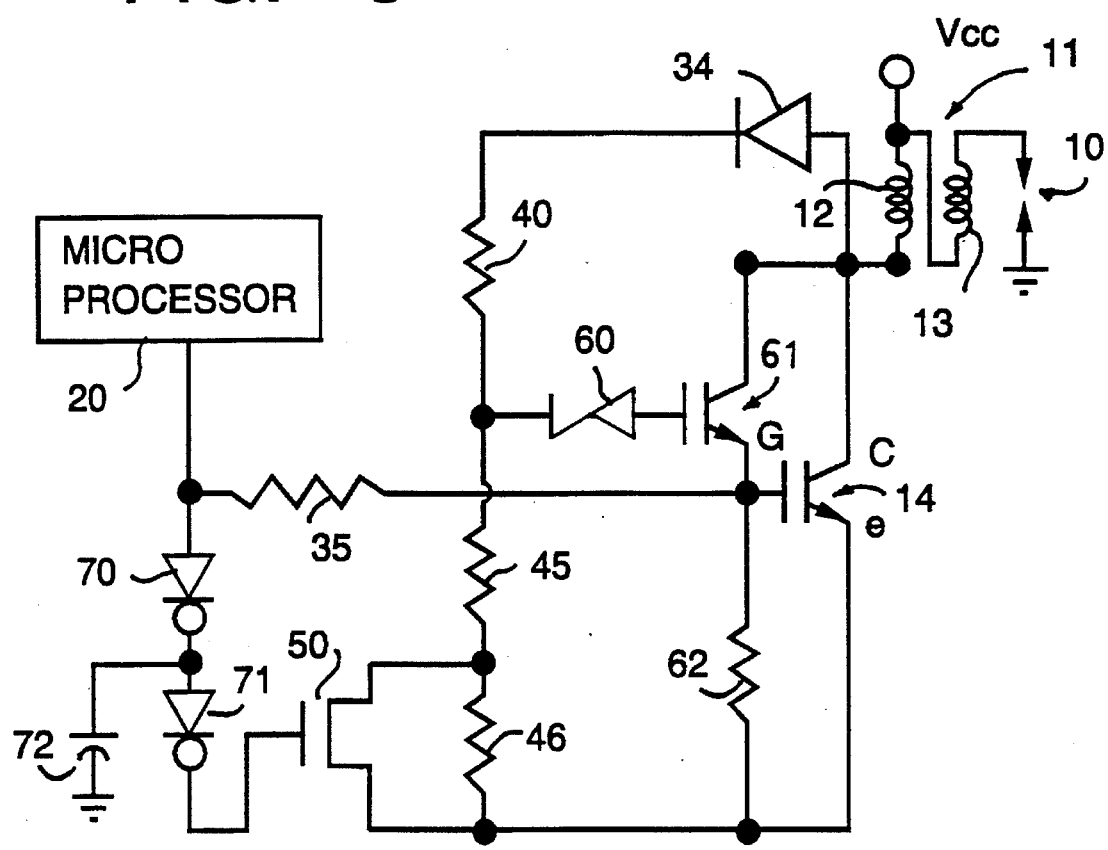
FIG. 3 is a circuit diagram of a third embodiment of the invention.

FIG. 3 shows a third embodiment of the invention in which a zener diode 60 and bipolar transistor 61 and resistor 62 are connected in the gate circuit of IGBT 14 to make the system less sensitive to variation of the gate voltage. The microprocessor 20 in FIG. 3 is connected to control MOSFET 50 through inverters 70 and 71 and capacitor 72. These components produce the necessary signal at time $t_4$ in FIGS. 5a and 5b to turn off MOSFET 50 at a fixed delay following the turn-off signal to IGBT 14 at time $t_2$. Thus, microprocessor 20 need not generate a separate signal to turn off MOSFET 50.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An ignition circuit for a spark plug comprising, in combination: an ignition transformer having a first winding means and a second winding means coupled to said first winding means and connectable to spark plug electrodes; a MOSgated power semiconductor device having first and second power electrodes and a gate electrode; means connecting said first winding means and said first and second power electrodes in series with one another and between a Vcc voltage terminal and a ground terminal; firing circuit means coupled to said gate electrode for producing turn-on and turn-off signals to said gate electrode; and foldback clamp circuit means connected to said MOSgated semiconductor device for clamping the voltage between said gate electrode and one of said power electrodes to a first clamping voltage for a first length of time, said first voltage and said first length of time being sufficient to produce a high enough voltage on said second winding means to fire said spark plug electrodes, said foldback clamp circuit means thereafter reducing said voltage between said gate electrode and said one of said power electrodes to a second clamping voltage which is substantially lower than said first clamping voltage.

2. The circuit of claim 1 wherein said MOSgated power semiconductor device is an IGBT.

3. The circuit of claim 2 wherein said IGBT has an area of about 14 mm² and an energy dissipation of about 200 millijoules.

4. The circuit of claim 1 wherein said foldback clamp circuit means causes a substantial reduction in the power dissipation in said power semiconductor device.

5. The circuit of claim 1 wherein said first clamping voltage is about 400 volts and said second clamping voltage is about 80 volts.

6. The circuit of claim 5 wherein said first length of time is less than about 20 microseconds.

7. The circuit of claim 6 wherein said foldback clamp circuit means causes a substantial reduction in the power dissipation in said power semiconductor device.

8. The circuit of claim 5 wherein said MOSgated power semiconductor device is an IGBT.

9. The circuit of claim 6 wherein said MOSgated power semiconductor device is an IGBT.

10. The circuit of claim 9 wherein said IGBT has an area of about 14 mm² and an energy dissipation of about 200 millijoules.

11. The circuit of claim 1 wherein said first length of time is less than about 20 microseconds.

12. The circuit of claim 11 wherein said MOSgated power semiconductor device is an IGBT.

13. The circuit of claim 1 wherein said foldback clamp circuit means includes at least one zener diode and at least one resistor connected in series with one another and in series with said first and second power electrodes of said MOSgated power semiconductor device, said first winding means connected to said first power electrode, the node between said at least one resistor and said at least one zener diode connected to said gate of said MOSgated power semiconductor device, and auxiliary transistor switching means having main electrodes coupled to short circuit one of said at least one of said zener diode or at least one resistor when turned on and a gate control circuit coupled to said firing circuit means for turning said auxiliary transistor switching means to one of its on or off conditions some predetermined time after the turn off of said MOSgated power semiconductor device.

14. The device of claim 13 wherein said auxiliary transistor switching means is a MOFSET.

15. The circuit of claim 13 wherein said MOSgated power semiconductor device is an IGBT.

16. The circuit of claim 15 wherein said foldback clamp circuit means causes a substantial reduction in the power dissipation in said power semiconductor device in the event of an open spark gap circuit.

17. The circuit of claim 16 wherein said first length of time is less than about 20 microseconds.

18. The circuit of claim 13 wherein said IGBT has an area of about 14 mm$^2$ and an energy dissipation of about 200 millijoules.

19. The circuit of claim 1 wherein said foldback clamp circuit means includes a plurality of resistors connected in series with one another and in series with said first and second power electrodes of said MOSgated power semiconductor device; the node between two of the resistors connected to the gate of said MOSgated power semiconductor device; said first winding means connected to said first power electrodes and auxiliary transistor switching means having main electrodes coupled to short circuit at least one of said plurality of resistors when turned on and a gate control circuit coupled to said firing circuit means for turning off said auxiliary transistor switching means a predetermined time after the turn off of said MOSgated power semiconductor device.

20. The device of claim 19 wherein said auxiliary transistor switching means is a MOFSET.

21. The circuit of claim 19 wherein said MOSgated power semiconductor device is an IGBT.

22. The circuit of claim 21 wherein said foldback clamp circuit means causes a substantial reduction in the power dissipation in said power semiconductor device in the event of an open spark gap circuit.

23. The circuit of claim 22 wherein said first length of time is less tan about 20 microseconds.

24. The circuit of claim 19 wherein said IGBT has an area of about 14 mm$^2$ and an energy dissipation of about 200 millijoules.

25. The circuit of claim 19 which further includes a bipolar transistor circuit having collector and emitter electrodes connected in parallel with said first electrode and said gate control electrode and further having a control electrode coupled to said at least one of said plurality of resistors through a zener diode, thereby to make said circuit less sensitive to gate voltage variation.

26. The device of claim 25 wherein said auxiliary transistor switching means is a MOFSET.

27. An ignition circuit for a spark plug comprising, in combination: an ignition transformer having a first winding means and a second winding means coupled to said first winding means and connectable to spark plug electrodes; a MOSgated power semiconductor device having first and second power electrodes and a gate electrode; means connecting said first winding means and said first and second power electrodes in series with one another and between a Vcc voltage terminal and a ground terminal; firing circuit means coupled to said gate electrode for producing turn-on and turn-off signals to said gate electrode; and foldback clamp circuit means connected to said MOSgated semiconductor device for clamping the voltage between said gate electrode and one of said power electrodes to a first clamping voltage for a first length of time, said first voltage and said first length of time being sufficient to produce a high enough voltage on said second winding means to fire said spark plug electrodes, said foldback clamp circuit means thereafter reducing said voltage between said gate electrode and said one of said power electrodes to a second clamping voltage which is substantially lower than said first voltage, said foldback clamp circuit means including a plurality of resistors connected in series with one another and in series with said first and second power electrodes of said MOSgated power semiconductor device; the node between two of the resistors connected to the gate of said MOSgated power semiconductor device; said first winding means connected to said first power electrodes and auxiliary transistor switching means having main electrodes coupled to short circuit at least one of said plurality of resistors when turned on and a gate control circuit coupled to said firing circuit means for turning off said auxiliary transistor switching means a predetermined time after the turn off of said MOSgated power semiconductor device; said gate control circuit including inverter delay circuit means for producing an off signal to said auxiliary transistor switching means with a given time delay following the turn-off signal for said MOSgated power semiconductor device from said firing circuit means.

28. The circuit of claim 27 wherein said MOSgated power semiconductor device is an IGBT.

29. The circuit of claim 28 wherein said foldback clamp circuit means causes a substantial reduction in the power dissipation in said power semiconductor device in the event of an open spark gap circuit.

30. The circuit of claim 29 wherein said first length of time is less than about 20 microseconds.

31. The circuit of claim 27 wherein said IGBT has an area of about 14 mm$^2$ and an energy dissipation of about 200 millijoules.

32. An ignition circuit for a spark plug comprising, in combination: an ignition transformer having a first winding means and a second winding means coupled to said first winding means and connectable to spark plug electrodes; a MOSgated power semiconductor device having first and second power electrodes and a gate electrode; means connecting said first winding means and said first and second power electrodes in series with one another and between a Vcc voltage terminal and a ground terminal; firing circuit means coupled to said gate electrode for producing turn-on and turn-off signals to said gate electrode; foldback clamp circuit means connected to said MOSgated semiconductor device for clamping the voltage between said gate electrode and one of said power electrodes to a first clamping voltage for a first length of time, said first voltage and said first length of time being sufficient to produce a high enough voltage on said second winding means to fire said spark plug electrodes, said foldback clamp circuit means thereafter reducing said voltage between said gate electrode and said one of said power electrodes to a second clamping voltage which is substantially lower than said first voltage, said foldback clamp circuit means including a plurality of resistors connected in series with one another and in series with said first and second power electrodes of said MOSgated power semiconductor device; the node between two of the resistors connected to the gate of said MOSgated power semiconductor device; said first winding means connected to said first power electrodes and auxiliary transistor switching means having main electrodes coupled to short circuit at least one of said plurality of resistors when turned on and a gate control circuit coupled to said firing circuit means for turning off said auxiliary transistor switching means a predetermined time after the turn off of said MOSgated power semiconductor device; said gate control circuit including inverter delay circuit means for producing an off signal to said auxiliary transistor switching means with a given time delay following the turn-off signal for said MOSgated power semiconductor device from said firing circuit means; and a bipolar transistor circuit having collector and emitter electrodes connected in parallel with said first electrode and said gate control electrode and further having a control electrode coupled to said at least one of said plurality of resistors through a zener diode, thereby to make said circuit less sensitive to gate voltage variation.

33. The circuit of claim 32 wherein said MOSgated power semiconductor device is an IGBT.

* * * * *